(12) United States Patent
Gamage et al.

(10) Patent No.: US 8,234,556 B2
(45) Date of Patent: Jul. 31, 2012

(54) BROADCAST RECEIVER AND METHOD FOR OPTIMIZING A SCALE FACTOR FOR A LOG-LIKELIHOOD MAPPER

(75) Inventors: Sahan S. Gamage, Cambridge (GB); Bernard Arambepola, Enfield (GB); Thushara Hewavithana, Borehamwood (GB); Parveen K. Shukla, Nottingham (GB); Vinesh Bhunjun, Potters Bar (GB)

(73) Assignee: Intel Corporation, Santa Clara, CA (US)

( * ) Notice: Subject to any disclaimer, the term of this patent is extended or adjusted under 35 U.S.C. 154(b) by 869 days.

(21) Appl. No.: 12/346,350

(22) Filed: Dec. 30, 2008

(65) Prior Publication Data

US 2010/0169734 A1     Jul. 1, 2010

(51) Int. Cl.
*H03M 13/03* (2006.01)
(52) U.S. Cl. ........ 714/794; 714/758; 714/795; 714/755; 714/752; 714/751; 714/774; 714/780; 714/786; 714/792; 714/796; 714/802; 375/345; 375/230; 375/233; 375/232
(58) Field of Classification Search .................. None
See application file for complete search history.

(56) References Cited

U.S. PATENT DOCUMENTS

| 2004/0225941 A1* | 11/2004 | Taffin | 714/755 |
|---|---|---|---|
| 2006/0107179 A1* | 5/2006 | Shen et al. | 714/758 |
| 2007/0089016 A1* | 4/2007 | Bhatt et al. | 714/752 |
| 2008/0165904 A1* | 7/2008 | Sidi et al. | 375/345 |
| 2008/0250300 A1* | 10/2008 | Mokhlesi et al. | 714/780 |
| 2010/0241921 A1* | 9/2010 | Gunnam | 714/752 |
| 2011/0103521 A1* | 5/2011 | Yu et al. | 375/340 |

FOREIGN PATENT DOCUMENTS

| WO | WO-2007/055533 A1 | 5/2007 |
|---|---|---|
| WO | WO-2007/066985 A1 | 6/2007 |
| WO | WO-2007/106876 A2 | 9/2007 |
| WO | WO-2008086229 A2 | 7/2008 |

OTHER PUBLICATIONS

"European Application Serial No. 09180644.8, European Search Report dated Apr. 27, 2010", 2 pgs.
"European Application Serial No. 09180644.8, Office Action mailed Oct. 18, 2011", 6 pgs.
Lu, B., et al., "Performance Analysis and Design Optimization of LDPC-Coded MIMO OFDM Systems", *IEEE Transactions on Signal Processing*, vol. 52, No. 2, (2004), 348-361.

\* cited by examiner

*Primary Examiner* — John Trimmings
(74) *Attorney, Agent, or Firm* — Schwegman, Lundberg & Woessner, P.A.; Gregory J. Gorrie (57) ABSTRACT

Embodiments of a broadcast receiver and method for optimizing a scale factor in a log-likelihood ratio (LLR) mapper are generally described herein. In some embodiments, the broadcast receiver includes an LLR mapper to generate LLRs from demodulated data samples, a low-density parity-check (LDPC) decoder to generate decoded data from the LLRs, and an LLR optimizer to dynamically select a scale factor for the LLR mapper based on a number of iterations for convergence of the LDPC decoder. In some embodiments, the LLR optimizer iteratively revises the scale factor during receipt of broadcast signals until the number of iterations of the iterative decoder is either minimized for convergence or minimized for convergence failures.

19 Claims, 3 Drawing Sheets

BROADCAST RECEIVER AND METHOD FOR OPTIMIZING A SCALE FACTOR FOR A LOG-LIKELIHOOD MAPPER

TECHNICAL FIELD

Some embodiments pertain to wireless communications. Some embodiments pertain to digital broadcast receivers, such as digital video broadcast (DVB) satellite receivers. Some embodiments pertain to decoding data in a receiver using log-likelihood ratios (LLRs).

BACKGROUND

Many conventional digital receivers use a forward error-correcting decoder, such as a low-density parity-check (LDPC) code decoder, to correct errors in the data that may occur during transmission. LDPC decoders can significantly reduce the probability of errors while allowing data transmission rates to approach the theoretical maximum Shannon limit. In many digital receivers, the LDPC decoder has been optimized under the assumption of additive white Gaussian noise (AWGN) in the channel. However, in many practical applications, the noise in communication channels is hardly ever white. For example, in satellite receiver channels, there may be correlated phase noise (e.g., a residual component after low frequency phase noise has been tracked out) and in terrestrial channels, there may be multi-path components. In orthogonal frequency division multiplexed (OFDM) receivers that perform equalization, even if the noise is white before equalization, it may not be white after equalization. This sub-optimal operation of an LDPC decoder in a digital receiver may result in increased power consumption and a decrease in signal-to-noise ratio (SNR) performance.

Thus, there are general needs for digital receivers and methods for improving the operations of forward error-correcting decoders. There are also needs for digital receivers that use less power and with increased SNR performance.

DETAILED DESCRIPTION

The following description and the drawings sufficiently illustrate specific embodiments to enable those skilled in the art to practice them. Other embodiments may incorporate structural, logical, electrical, process, and other changes. Examples merely typify possible variations. Individual components and functions are optional unless explicitly required, and the sequence of operations may vary. Portions and features of some embodiments may be included in, or substituted for, those of other embodiments. Embodiments set forth in the claims encompass all available equivalents of those claims.

Figure 1:
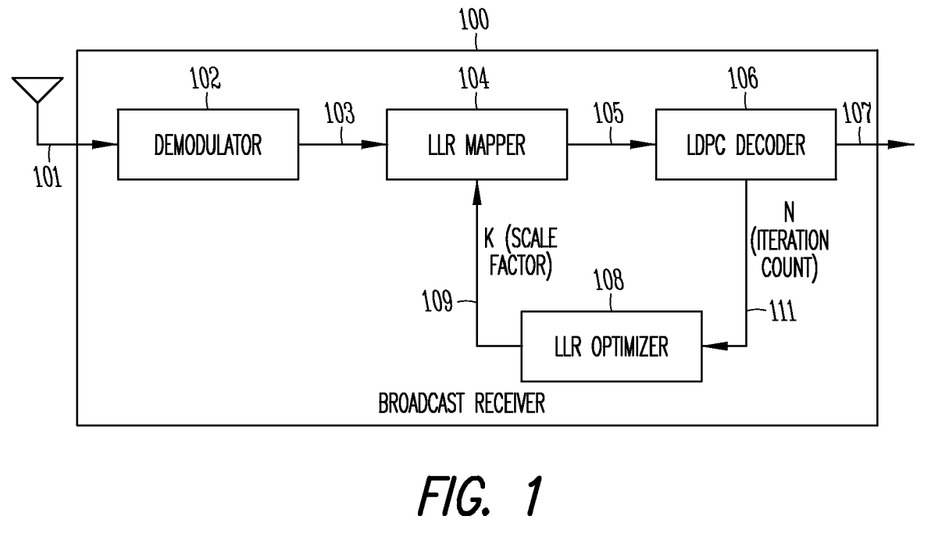
FIG. 1 is a functional block diagram of a broadcast receiver in accordance with some embodiments.

FIG. 1 is a functional block diagram of a broadcast receiver in accordance with some embodiments. Broadcast receiver 100 may be any digital receiver that demodulates and decodes signals received through a channel. Broadcast receiver 100 includes demodulator 102, log-likelihood ratio (LLR) mapper 104, low-density parity-check (LDPC) decoder 106, and LLR optimizer 108. Demodulator 102 may demodulate broadcast signals received through antenna 101 to generate demodulated data samples 103. LLR mapper 104 may generate LLRs 105 from demodulated data samples 103. LDPC decoder 106 may generate decoded data 107 from LLRs 105. LLR optimizer 108 may provide scale factor (K) 109 for LLR mapper 104 for use by LLR mapper 104 in generating LLRs 105 from demodulated data samples 103. Scale factor 109 is used by LLR mapper 104 to amplitude scale demodulated data samples 103 for use in generating LLRs 105 to provide to LDPC decoder 106.

In accordance with embodiments, LLR optimizer 108 may dynamically select scale factor 109 based on a number of iterations (N) 111 for convergence of LDPC decoder 106. In some embodiments, when LDPC decoder 106 converges most of the time within a predetermined number of LDPC frames, the scale factor that minimizes the number of iterations 111 for convergence is selected as an optimum scale factor. When LDPC decoder 106 fails to converge most of the time within a predetermined number of LDPC frames, the scale factor that minimizes the number of convergence failures is selected as the optimum scale factor. In these embodiments, the selected optimum scale factor may be used as scale factor 109 to decode at least a predetermined number of LDPC frames. After the predetermined number of LDPC frames, scale factor 109 may be checked to verify that it is still the optimum scale factor, or scale factor 109 may be updated due to changes in the channel conditions.

Convergence most of the time within a predetermined number of LDPC frames, as used herein, means that LDPC decoder 106 converges more than approximately 75% of the time when decoding a predetermined number of LDPC frames (e.g., 100 frames). Failure to converge most of the time within a predetermined number of LDPC frames means that LDPC decoder 106 does not converge more than approximately 75% of the time when decoding a predetermined number of LDPC frames. In other embodiments, other percentages (i.e., percentages greater than 50%) for convergence most of the time or failure to converge most of time may be used.

LLR optimizer 108 may be configured to optimize scale factor 109 during receipt of signals, such as broadcast signals. In these embodiments, the optimization of scale factor 109 may occur during normal receiver operations allowing a user to receive broadcast signals during the optimization process. In some embodiments, scale factor 109 may be iteratively revised during receipt of broadcast signals until the number of iterations 111 of LDPC decoder 106 is either minimized for convergence or minimized for convergence failures.

Conventionally, LLR mapping is usually optimized at the design stage by assuming that AWGN is present in the channel. In practical situations, this is not usually the case; therefore, the LLR mapping is sub-optimal. Since the LLR mapping is sub-optimal, the subsequent operations performed by an LDPC decoder are also suboptimal. This results in increased power consumption due to an increased number of iterations of the decoder and/or reduced SNR performance.

Broadcast receiver 100, on the other hand, implements an adaptive process that optimizes the performance of LDPC decoder 106 with respect to LLR mapping performed by LLR mapper 104 during operational use in the presence of practical noise. In some embodiments, LLR optimizer 108 may provide an initial scale factor (K) 109 to LLR mapper 104, determine an initial average number of iterations ($N_0$) for LDPC decoder 106 to converge when the initial scale factor is used by LLR mapper 104, and revise the initial scale factor by applying a small perturbation (ΔK) to the initial scale factor (e.g., K=K+ΔK). LLR optimizer 108 may also determine a revised average number of iterations ($N_1$) for LDPC decoder 106 to converge when the revised scale factor is used by LLR mapper 104. LLR optimizer 108 may select the revised scale factor as an optimum scale factor when the initial average number of iterations ($N_0$) is approximately equal to the revised average number of iterations ($N_1$). In these embodiments, when an optimum scale factor is found, LLR optimizer 108 may cause LLR mapper 104 to continue to use the optimum scale factor as scale factor 109 at least for a predetermined period of time. At pre-defined intervals, the process of optimizing the scale factor may be repeated in order to keep the value of scale factor 109 close to an optimum value. In these embodiments, selection of the optimum scale factor based on the minimum number of iterations for convergence may be used when LDPC decoder 106 converges most of the time.

In some embodiments, a waiting period of approximately 100 LDPC frames may be included to capture sufficient data for the values of $N_0$ and $N_1$ to be statistically meaningful. In these embodiments, a maximum limit for the number of iterations may be set and may be used when LDPC decoder 106 fails to converge. These embodiments are discussed in more detail below.

The value of scale factor 109 may depend on the implementation details of broadcast receiver 100. In some software implementations, scale factor 109 may range between 2.0 and 3.0, and an initial scale factor of approximately 2.5 may be selected, although the scope of the embodiments is not limited in this respect. The perturbation (ΔK) may be relatively small and may range from approximately 0.02 to 0.2 for an initial scale factor of 2.5. In some embodiments, a larger perturbation (e.g., 0.2) may be initially used until a minima is determined, and then a smaller perturbation (e.g., 0.02) may be used to determine an optimum scale factor.

In some embodiments, when the initial average number of iterations ($N_0$) is not approximately equal to the revised average number of iterations ($N_1$), LLR optimizer 108 may further revise scale factor 109 by the perturbation (Δk) until the number of iterations 111 of LDPC decoder 106 does not substantially change between revisions of scale factor 109. When the initial average number of iterations ($N_0$) is greater than the revised average number of iterations ($N_1$), LLR optimizer 108 may further increase scale factor 109 by the perturbation (ΔK) until the number of iterations of the LDPC decoder 106 does not substantially change between each revision of the scale factor. When the initial average number of iterations ($N_0$) is less than the revised average number of iterations ($N_1$), LLR optimizer 108 may decrease scale factor 109 by the perturbation (ΔK) until the number of iterations 111 of LDPC decoder 1-6 does not substantially change between each revision of scale factor 109. A final scale factor is selected as the optimum scale factor when the average numbers of iterations does not substantially change between revisions of scale factor 109. The optimum scale factor may be continued to be provided by LLR optimizer 108 as scale factor 109 to LLR mapper 104.

In some embodiments, LLR optimizer 108 may select a scale factor to minimize the number of failures. In these embodiments, when LDPC decoder 106 fails to converge within a predetermined number of LDPC frames most of the time when an initial scale factor is used by LLR mapper 104, LLR optimizer 108 may select the optimum scale factor based on a lowest number of iterations 111 in which LDPC decoder 106 fails to decode for a predetermined maximum number of LDPC frames.

In some embodiments, LDPC decoder 106 may be configured to provide an indication of the number of iterations 111 for convergence as an output to LLR optimizer 108. In these embodiments, convergence occurs when a parity-check match occurs. LDPC decoder 106 may perform a parity-check calculation at the end of each iteration. When the result of the parity check is zero, then the parity check is satisfied and no more iterations are necessary to decode the block of data. In some embodiments in which broadcast receiver 100 is a DVB-S2 receiver, the LDPC block size that is decoded may be 64800 bits. In these embodiments, many parity checks are defined for the different subsets of the block of bits using a parity-check matrix. When all parity checks of the matrix are satisfied, no further iterations are required and LDPC decoder 106 passes a decoded block to the next stage of broadcast receiver 100 for further processing. In some of these embodiments, LDPC decoder 106 may be configured to provide the number of iterations 111 that has taken to obtain a parity check match as an output.

In some embodiments, LLR optimizer 108 determines the number of iterations 111 by monitoring a parity check after each iteration of LDPC decoder 106. In these embodiments, the number of parity checks that are performed may be used by LLR optimizer 108 to determine the number of iterations 111 for convergence. The result of the parity checks (rather than the number of the parity checks) may also be used to determine the number of iterations 111 for convergence.

When LDPC decoder 106 fails to converge, the number of parity checks that are performed may be used by LLR optimizer 108 to determine the number of iterations 111 for selecting scale factor 109. In these embodiments, LDPC decoder 106 may introduces an upper limit to the number of iterations that are performed to allow broadcast receiver 100 to operate in real time. If the parity checks are not satisfied even after reaching the upper limit, then the current frame (e.g., a block of bits) has not been properly decoded and has bit errors. In these embodiments, this may be treated as a convergence failure. In some embodiment, the upper limit to the number of iterations may be 50, although the scope of the embodiments is not limited in this respect.

In some embodiments, broadcast receiver 100 may be a digital video broadcast (DVB) receiver configured to receive and demodulate signals in accordance with second generation satellite (DVB-S2) standards, terrestrial (DVB-T2) standards, or cable (DVB-C2) standards. In some other embodiments, broadcast receiver 100 may be a Worldwide Interoperability for Microwave Access (WiMAX) receiver configured to receive and demodulate broadcast signals in accordance with one of the Institute of Electrical and Electronics Engineers (IEEE) 802.16 standards. In some other embodiments, broadcast receiver 100 may be a Worldwide Interoperability for Universal Terrestrial Radio Access Network (UTRAN) Long-Term-Evolution (LTE) receiver configured to receive and demodulate broadcast signals in accordance with one of the 3rd Generation Partnership Project (3GPP) UTRAN LTE standards. In WiMAX and LTE embodiments, the received signals may be OFDM signals which may be demodulated by demodulator 102. In some alternate embodiments, the received signals may be code-division multiple access (CDMA) signals, which may be demodulated by demodulator 102.

Although broadcast receiver 100 is illustrated as having several separate functional elements, one or more of the functional elements may be combined and may be implemented by combinations of software-configured elements, such as processing elements, including digital signal processors (DSPs), and/or other hardware elements. For example, some elements may comprise one or more microprocessors, DSPs, application-specific integrated circuits (ASICs), radio-frequency integrated circuits (RFICs), and combinations of various hardware and logic circuitry for performing at least the functions described herein. In some embodiments, the functional elements of broadcast receiver 100 may refer to one or more processes operating on one or more processing elements.

In some embodiments, a digital receiver is provided that includes a mapper to generate soft decisions from demodulated data samples, an iterative decoder to generate decoded data from the soft decisions, and an optimizer to dynamically select a scale factor for the mapper based on a number of iterations for convergence of the iterative decoder. The optimizer iteratively revises the scale factor during receipt of broadcast signals until the number of iterations of the iterative decoder is either minimized for convergence or minimized for convergence failures. When the iterative decoder converges most of the time within a predetermined number of frames, the scale factor that minimizes the number of iterations for convergence is selected as an optimum scale factor. When the iterative decoder fails to converge most of the time within a predetermined number of frames, the scale factor that minimizes the number of convergence failures is selected as the optimum scale factor. In these embodiments, the scale factor is used by the mapper to amplitude scale demodulated data samples for use in generating the soft decisions for the decoder. In these embodiments, the optimizer may determine the number of iterations by monitoring a parity check after each iteration of the iterative decoder, although the scope of the embodiments is not limited in this respect. In some of these embodiments, the digital receiver is a broadcast receiver such as broadcast receiver 100, the mapper is a LLR mapper such as LLR mapper 104, the iterative decoder is a LDPC decoder such as LDPC decoder 106, and the soft decisions may be LLRs 105

Figure 2:
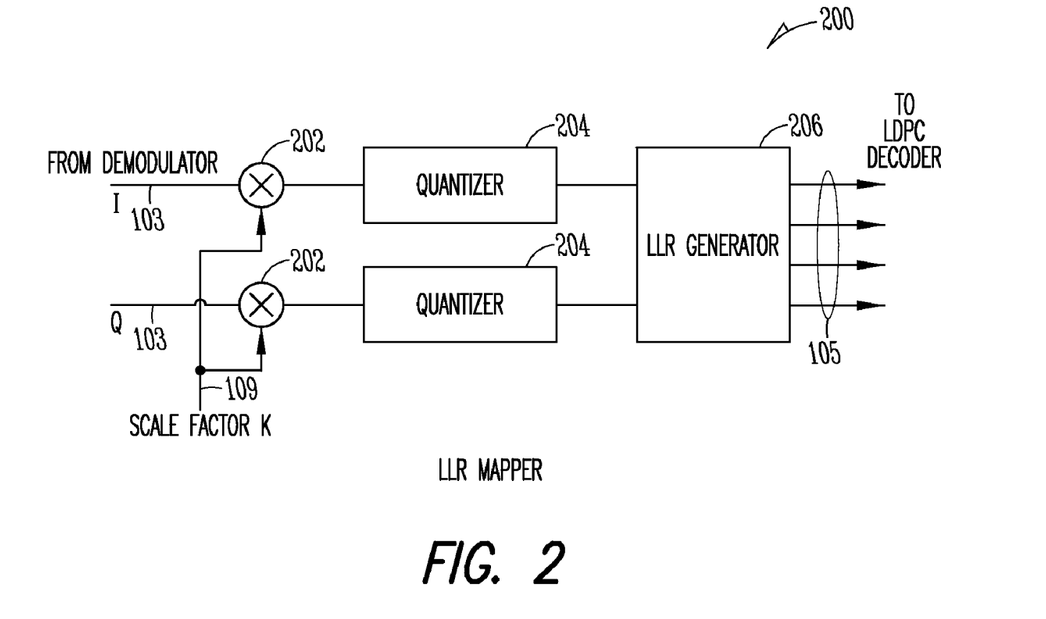
FIG. 2 is a functional block diagram of a log-likelihood ratio (LLR) mapper in accordance with some embodiments.

FIG. 2 is a functional block diagram of an LLR mapper in accordance with some embodiments. LLR mapper 200 may be suitable for use as LLR mapper 104 (FIG. 1) although other configurations may also be suitable. LLR mapper 200 may include scaling elements 202 to amplitude scale demodulated data samples 103 by scale factor 109. LLR mapper 200 may also include quantizers 204 to quantize the amplitude-scaled demodulate data samples to generate quantized data samples. LLR mapper 200 may also include LLR generator 206 to generate LLRs 105 from the quantized data samples provided by quantizers 202. In some embodiments, quantizers 204 may quantize the amplitude-scaled demodulated data samples to a predetermined number of bits (e.g., 6 or 8 bits) by taking the integer part of the amplitude-scaled demodulate data samples. In some embodiments, LLR generator 206 may use a look-up table to generate LLRs 105 from the quantized data samples, although the scope of the embodiments is not limited in this respect as LLR generator 206 may use one or more LLR generating algorithms to generate LLRs 105.

For multiple phase-shift keying (M-PSK) demodulation, assuming constellation positions are in the unit circle, LLRs 105 generated by LLR generator 206 may be defined by the following equation:

$$LLR = \ln(p(0/R)/p(1/R))$$

$$= \ln\left\{\frac{\sum_{k \in S_0} \exp\left(-\frac{|R - W^k|^2}{2\sigma_N^2}\right)}{\sum_{k \in S_1} \exp\left(-\frac{|R - W^k|^2}{2\sigma_N^2}\right)}\right\}$$

$$= \ln\left\{\frac{\sum_{k \in S_0} \exp\left(-\frac{Re\{RW^{-k}\}}{\sigma_N^2}\right)}{\sum_{k \in S_1} \exp\left(-\frac{Re\{RW^{-k}\}}{\sigma_N^2}\right)}\right\}$$

where $W = \exp(j2\pi/M)$ and $W^k$ are the constellation points. Note that the above LLR or soft decision is for a specific binary bit. This bit is zero in the set $S_0$ of constellation points and it is one in the set $S_1$ of constellation points. R is the received complex signal and $\sigma_N$ is the standard deviation of the Gaussian noise process. When LDPC decoder 106 (FIG. 1) is implemented with double precision (floating point), the above equations (or their simplified forms for lower modulations levels such as QPSK) may directly be used for LLR calculations. For many applications such as DVB-S2, LDPC decode 106 may be implemented in hardware and there is a need to use relatively short wordlengths. For example, in DVB-S2 embodiments, LDPC decoder 106 (FIG. 1) may use 6-bit LLRs. In these embodiments, LLR generator 206 may implement the above equation as a look-up table.

Figure 3:
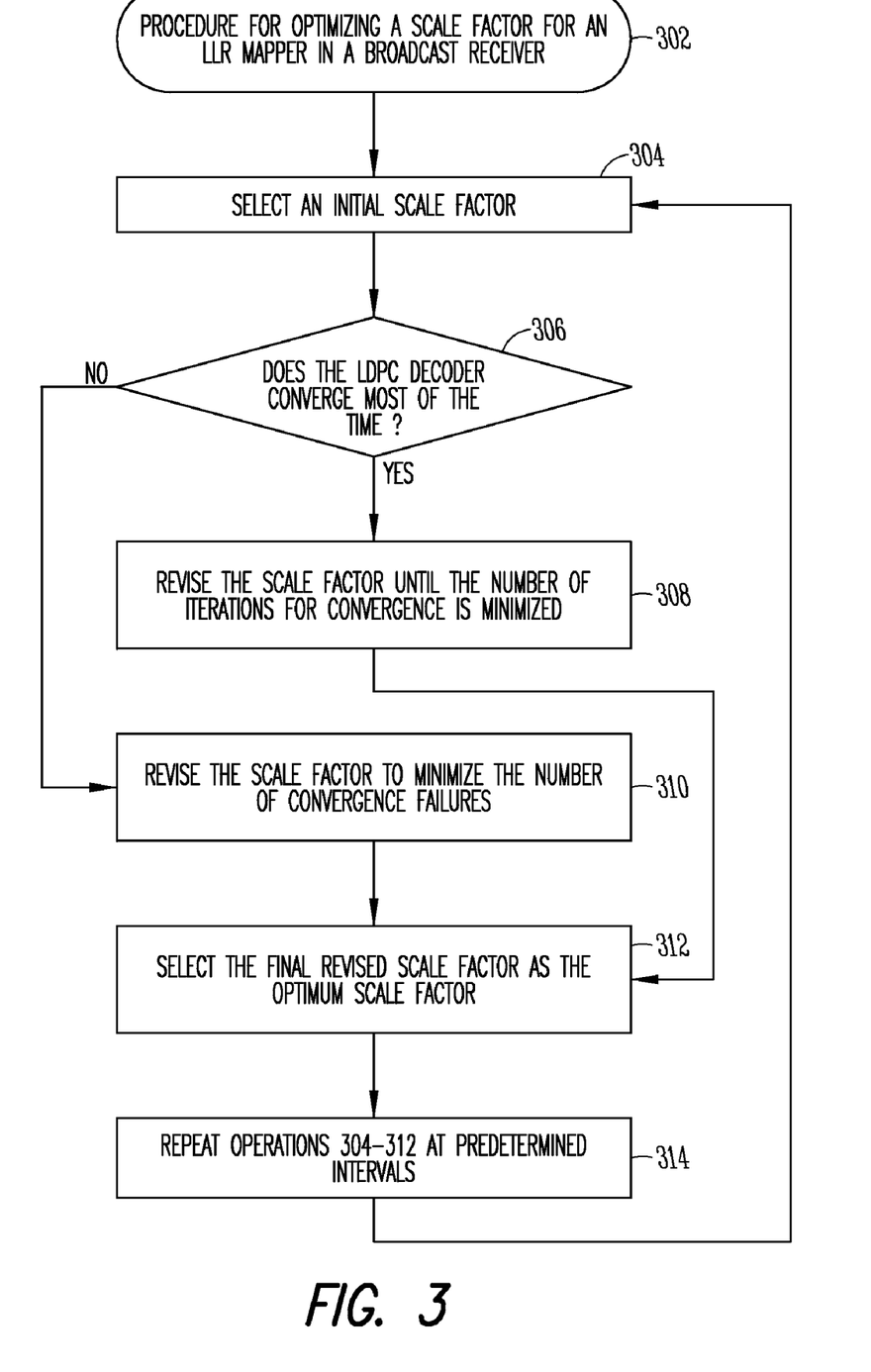
FIG. 3 is a flow chart of a procedure for optimizing a scale factor in a LLR mapper in accordance with some embodiments.

FIG. 3 is a flow chart of a procedure for optimizing a scale factor in a LLR mapper in accordance with some embodiments. Procedure 302 may be performed by an LLR optimizer, such as LLR optimizer 108 (FIG. 1) operating within a digital receiver, such as broadcast receiver 100 (FIG. 1). Procedure 302 may optimize scale factor 109 (FIG. 1) and may be performed during receipt of broadcast signals. In some embodiments, the scale factor may be revised iteratively during receipt of broadcast signals until the number of iterations 111 (FIG. 1) of LDPC decoder 106 (FIG. 1) is minimized for convergence or minimized for convergence failures. The following description refers to FIGS. 1 and 3 together.

In operation 304, an initial scale factor is selected by LLR optimizer 108. The initial scale factor may then be applied as scale factor 109 to LLR mapper 104 for a predetermined number of LDPC frames.

In operation 306, after the initial scale factor is applied to LLR mapper 104 for a predetermined number of LDPC frames, LLR optimizer 108 determines whether LDPC decoder 106 converges most of the time. When LDPC decoder 106 converges most of the time, operation 308 is performed. When LDPC decoder 106 does not converge most of the time, operation 310 is performed.

In operation 308, scale factor 109 is revised until the number of iterations for convergence is minimized. The final revised scale factor is selected as the optimum scale factor in operation 312.

In operation 310, scale factor 109 is revised to minimize the number of convergence failures. The final revised scale factor is selected as the optimum scale factor in operation 312.

In operation 314, operations 304-312 are repeated at predetermined intervals (i.e., a predetermined number of LDPC frames). In this way, broadcast receiver 100 may be able to respond dynamically to changing channel conditions and maintain an optimum scale factor. Accordingly, power consumption may be reduced and SNR performance may be increased.

Although the individual operations of procedure 302 are illustrated and described as separate operations, one or more of the individual operations may be performed concurrently, and nothing requires that the operations be performed in the order illustrated.

In some embodiments, operation 308 may include:

Starting with the initial scale factor K and determining the average number of iterations ($N_0$) LDPC decoder 106 takes to converge;

Applying a small perturbation ($\Delta k$) to K:

$$K \leftarrow K + \Delta K$$

Determining the average number of iterations ($N_1$) the LDPC takes to converge with the revised K.

Comparing $N_0$ with $N_1$

If $N_0 \approx N_1$ exiting operation 308 since an optimum K has been found.

If $N_0 > N_1$ returning to the step of applying the small perturbation to K with no change in the sign of $\Delta K$ and after setting: $N_0 \leftarrow N_1$ If $N_0 < N_1$ returning to the step of applying the small perturbation to K after toggling the sign of $\Delta K$ and after setting: $N_0 \leftarrow N_1$.

In some embodiments, operation 310 may include:

Starting with an initial or nominal value of K and determining the average number of iterations ($N_0$) LDPC decoder 106 takes to converge over a relatively large (e.g., 100) number of frames. If LDPC decoder 106 fails to converge during most of these frames, then $N_0$ may be unreliable. In such a case, the number of times ($F_0$) may be stored when LDPC decoder 106 fails to converge. If $F_0$ is below a predetermined threshold (i.e., LDPC decoder 106 converges most of the time), then $F_0$ is set to zero and $N_0$ may be reliable.

Applying a small perturbation to K:

$$K \leftarrow K + \Delta K$$

Repeating the measurements in the above step and generating $N_1$ and $F_1$.

Comparing $F_0$ with $F_1$

If both of these are zero, then proceeding to the comparison of $N_0$ and $N_1$ below.

If $F_0 \leq F_1$ then returning to the step of applying the small perturbation to K after toggling the sign of $\Delta K$ and after setting: $F_0 \leftarrow F_1$ and $N_0 \leftarrow N_1$ If $F_0 > F_1$ then returning to the step of applying the small perturbation to K with no change to the sign of $\Delta K$ and after setting: $F_0 \leftarrow F_1$ and $N_0 \leftarrow N_1$ Operation 310 may be exited when K corresponding to a minimum F has been found.

However, if LDPC decoder 106 exhibits complete failure, then these comparisons may become meaningless. In such a case, the value K may be stepped from its minimum to its maximum, and the value for K that provides a minimum number of convergence failures may be determined as described below.

Comparing $N_0$ with $N_1$

If $N_0 \approx N_1$ exiting the algorithm since an optimum K has been found.

If $N_0 > N_1$ returning to the step of applying the small perturbation to K with no change in the sign of $\Delta K$ after setting: $N_0 \leftarrow N_1$ If $N_0 < N_1$ returning to the step of applying the small perturbation to K after toggling the sign of $\Delta K$ and after setting: $N_0 \leftarrow N_1$.

The processes described above may be modified to match a given implementation. The optimum value of the scale factor for LLR mapping may be determined that minimizes the number of iterations of LDPC decoder 106. If the iteration count is unreliable because of high noise levels, then the value of K that minimizes LDPC failures may be determined.

Unless specifically stated otherwise, terms such as "processing," "computing," "calculating," "determining," "displaying," or the like, may refer to an action and/or process of one or more processing or computing systems or similar devices that may manipulate and transform data represented as physical (e.g., electronic) quantities within a processing system's registers and memory into other data similarly represented as physical quantities within the processing system's registers or memories, or other such information storage, transmission or display devices. Furthermore, as used herein, a computing device includes one or more processing elements coupled with computer-readable memory that may be volatile or non-volatile memory or a combination thereof.

Embodiments may be implemented in one or a combination of hardware, firmware and software. Embodiments may also be implemented as instructions stored on a computer-readable medium, which may be read and executed by at least one processor to perform the operations described herein. A computer-readable medium may include any tangible medium for storing or transmitting information in a form readable by a machine (e.g., a computer). For example, a computer-readable medium may include read-only memory (ROM), random-access memory (RAM), magnetic disk storage media, optical storage media, flash-memory devices, and others.

The Abstract is provided to comply with 37 C.F.R. Section 1.72(b) requiring an abstract that will allow the reader to ascertain the nature and gist of the technical disclosure. It is submitted with the understanding that it will not be used to limit or interpret the scope or meaning of the claims. The following claims are hereby incorporated into the detailed description, with each claim standing on its own as a separate embodiment.

What is claimed is:

1. A digital receiver comprising:
a log-likelihood ratio (LLR) mapper to generate LLRs from demodulated data samples;
a low-density parity-check (LDPC) decoder to generate decoded data from the LLRs; and
an LLR optimizer to dynamically select a scale factor for the LLR mapper to minimize a number of iterations for convergence when the LDPC decoder converges and minimize a number of convergence failures when the LDPC decoder fails to converge.

2. A digital receiver comprising:
a log-likelihood ratio (LLR) mapper to generate LLRs from demodulated data samples;
a low-density parity-check (LDPC) decoder to generate decoded data from the LLRs; and
an LLR optimizer to dynamically select a scale factor for the LLR mapper based on a number of iterations for convergence of the LDPC decoder,
wherein when the LDPC decoder converges most of the time within a predetermined number of LDPC frames, the scale factor that minimizes the number of iterations for convergence is selected as an optimum scale factor, and
wherein when the LDPC decoder fails to converge most of the time within the predetermined number of LDPC frames, the scale factor that minimizes the number of convergence failures is selected as the optimum scale factor.

3. The digital receiver of claim 2, wherein the LLR optimizer is configured to optimize the scale factor during receipt of broadcast signals.

4. The digital receiver of claim 2, wherein the LLR optimizer is configured to:
provide an initial scale factor to the LLR mapper;
determine an initial average number of iterations for the LDPC decoder to converge when the initial scale factor is used by the LLR mapper;
revise the scale factor by applying a perturbation to the scale factor;
determine a revised average number of iterations for the LDPC decoder to converge when the revised scale factor is used by the LLR mapper; and
select the revised scale factor as an optimum scale factor when the initial average number of iterations is approximately equal to the revised average number of iterations.

5. The digital receiver of claim 4, wherein when the initial average number of iterations is not approximately equal to the revised average number of iterations, the LLR optimizer is configured to:
further revise the scale factor by the perturbation until the number of iterations of the LDPC decoder does not substantially change between revisions of the scale factor.

6. The digital receiver of claim 4, wherein when the initial average number of iterations is greater than the revised average number of iterations, the LLR optimizer is configured to further increase the scale factor by the perturbation until the number of iterations of the LDPC decoder does not substantially change between each revision of the scale factor,
wherein when the initial average number of iterations is less than the revised average number of iterations, the LLR optimizer is configured to decrease the scale factor by the perturbation until the number of iterations of the LDPC decoder does not substantially change between each revision of the scale factor, and
wherein a final scale factor is selected as the optimum scale factor when the average numbers of iterations does not substantially change between revisions of the scale factor.

7. The digital receiver of claim 4, wherein when the LDPC decoder fails to converge within the predetermined number of LDPC frames most of the time when the initial scale factor is used by the LLR mapper, the LLR optimizer is further configured to select the optimum scale factor to minimize the number of convergence failures over a predetermined maximum number of LDPC frames.

8. The digital receiver of claim 4, wherein the LDPC decoder is configured to provide an indication of the number of iterations for convergence as an output to the LLR optimizer.

9. The digital receiver of claim 4, wherein the LLR optimizer determines the number of iterations by monitoring a parity check after each iteration of the LDPC decoder.

10. The digital receiver of claim 3, wherein the LLR mapper comprises:
scaling elements to amplitude scale the demodulated data samples by the scale factor for use by the LLR mapper in generating the LLRs, the scale factor being provided by the LLR optimizer;
quantizers to quantize the amplitude-scaled demodulate data samples; and
an LLR generator to generate the LLRs from quantized data samples provided by the quantizers.

11. The digital receiver of claim 2, wherein the digital receiver is a digital video broadcast (DVB) receiver configured to receive and demodulate signals in accordance with second generation satellite (DVB-S2) standards, terrestrial (DVB-T2) standards, or cable (DVB-C2) standards.

12. The digital receiver of claim 2, wherein the digital receiver is a Worldwide Interoperability for Microwave Access (WiMAX) receiver configured to receive and demodulate broadcast signals in accordance with one of the Institute of Electrical and Electronics Engineers (IEEE) 802.16 standards.

13. A method for selecting a scale factor for a log-likelihood ratio (LLR) mapper in a digital receiver, the method comprising:
dynamically selecting the scale factor for the LLR mapper to minimize a number of iterations for convergence when a low-density parity check (LDPC) decoder converges and minimize a number of convergence failures when the LDPC decoder fails to converge.

14. A method for selecting a scale factor for a log-likelihood ratio (LLR) mapper in a digital receiver, the method comprising:
dynamically selecting the scale factor for the LLR mapper based on a number of iterations for convergence of a low-density parity check (LDPC) decoder,
wherein when the LDPC decoder converges most of the time within a predetermined number of LDPC frames, the method comprises selecting a scale factor that minimizes the number of iterations for convergence, and
wherein when the LDPC decoder fails to converge most of the time within a predetermined number of LDPC frames, the method comprises selecting a scale factor that minimizes the number of convergence failures.

15. The method of claim 14 further comprising iteratively revising the scale factor during receipt of broadcast signals until the number of iterations of the LDPC decoder is either minimized for convergence or minimized for convergence failures.

16. The method of claim 15 further comprising determining the number of iterations by monitoring a parity check after each iteration of the LDPC decoder.

17. A receiver comprising:
a mapper to generate soft decisions from demodulated data samples;
an iterative decoder to generate decoded data from the soft decisions; and
an optimizer to dynamically select a scale factor for the mapper based on a number of iterations for convergence of the iterative decoder,
wherein the optimizer iteratively revises the scale factor during receipt of broadcast signals until the number of iterations of the iterative decoder is either minimized for convergence or minimized for convergence failures,
wherein when the iterative decoder converges most of the time within a predetermined number of frames, the scale factor that minimizes the number of iterations for convergence is selected as an optimum scale factor, and
wherein when the iterative decoder fails to converge most of the time within a predetermined number of frames, the scale factor that minimizes the number of convergence failures is selected as the optimum scale factor.

18. The receiver of claim 17, wherein the optimizer determines the number of iterations by monitoring a parity check after each iteration of the iterative decoder, and wherein the scale factor is used by the mapper to amplitude scale the demodulated data samples for generating the soft decisions.

19. The receiver of claim 17, wherein the receiver is a broadcast receiver, the mapper is a log-likelihood ratio (LLR) mapper configured generate LLRs from demodulated data samples, the iterative decoder is a low-density parity-check (LDPC) decoder, and the scale factor is used by the LLR mapper to amplitude scale the demodulated data samples by the scale factor for use in generating LLRs corresponding to the soft decisions.

* * * * *

UNITED STATES PATENT AND TRADEMARK OFFICE
CERTIFICATE OF CORRECTION

PATENT NO. : 8,234,556 B2  Page 1 of 1
APPLICATION NO. : 12/346350
DATED : July 31, 2012
INVENTOR(S) : Gamage et al.

It is certified that error appears in the above-identified patent and that said Letters Patent is hereby corrected as shown below:

On the title page, in item (75), in "Inventors", in column 1, line 4, delete "Nottignham" and insert --Nottingham--, therefor On the title page, in column 2, under "Other Publications", line 2, delete "dated" and insert --mailed--, therefor On page 2, in column 2, under "Other Publications", line 8, after "Lu, B., et al., "Performance Analysis and Design Optimization of LDPC-Coded MIMO OFDM Systems", IEEE Transactions on Signal Processing, vol. 52, No. 2, (2004); 348-361.", insert --"Japanese Application Serial No. 2009-292859, Office Action mailed Feb. 21, 2012", With English Translation, 6 pgs.
"Japanese Application Serial No. 2009-292859, Response filed May 17, 2012 to Office Action mailed Feb. 21, 2012". 5 pgs.--, therefor In column 11, line 6, in claim 19, before "generate", insert --to--, therefor Signed and Sealed this
Fourth Day of December, 2012

David J. Kappos
*Director of the United States Patent and Trademark Office*